United States Patent [19]

Fenstermaker et al.

[11] Patent Number: 5,345,419

[45] Date of Patent: Sep. 6, 1994

[54] FIFO WITH WORD LINE MATCH CIRCUITS FOR FLAG GENERATION

[75] Inventors: Larry R. Fenstermaker, Nazareth, Pa.; Kevin J. O'Connor, Lebonon, N.J.

[73] Assignee: AT&T Bell Laboratories, Murray Hill, N.J.

[21] Appl. No.: 15,769

[22] Filed: Feb. 10, 1993

[51] Int. Cl.$^5$ ............................................... G11C 8/00
[52] U.S. Cl. ............................. 365/189.04; 365/221; 365/219; 365/222; 365/189.07
[58] Field of Search ................... 365/189.04, 221, 222, 365/219, 189.07, 78, 189.05, 220, 189.02

[56] References Cited

U.S. PATENT DOCUMENTS

| | | | |
|---|---|---|---|
| 4,535,427 | 8/1985 | Jiang | 365/205 |
| 4,694,426 | 9/1987 | Mason | 365/78 |
| 4,875,196 | 10/1989 | Spaderna et al. | 365/221 |
| 5,027,330 | 6/1991 | Miller | 365/239 |
| 5,228,002 | 7/1993 | Huang | 365/221 |

Primary Examiner—Eugene R. LaRoche
Assistant Examiner—Huan Hoang
Attorney, Agent, or Firm—James H. Fox

[57] ABSTRACT

A first in, first out memory (FIFO) includes a multi-port memory array, which is accessed for read/write operations by activating a selected read or write word line. The read word line is controlled by a read shift register, and the write word line is controlled by a write shift register. In order to generate "full" and "empty" flags, the voltage state of read and write word lines are determined in "match circuits", which compare the locations of the read and write pointers. This eliminates the use of counters, and allows the shift registers and word line match circuits to be an integral part of a single-block regular structure. Furthermore, it allows the FIFO to be readily expanded to multiple numbers of words and bits per word.

13 Claims, 3 Drawing Sheets

FIFO WITH WORD LINE MATCH CIRCUITS FOR FLAG GENERATION

BACKGROUND OF THE INVENTION

1. Field of the Invention

The present invention concerns an integrated circuit having a first in, first out memory (FIFO).

2. Description of the Prior Art

First in, first out memories (FIFOs) are commonly used in systems to facilitate communications between a device that writes into the FIFO, and a device that reads from the FIFO. These devices often operate asynchronously to one another, with the FIFO providing a buffer memory between them. (However, synchronous systems may also use a FIFO). Often, a dual-port memory array is used to implement the FIFO memory, with a first port serving as the read port, and the second port serving as the write port. This conveniently allows for simultaneously reading from, and writing into, separate memory locations. (However, designs using single-port memories are also known.) Although various physical configurations are possible, the FIFO memory array for illustrative purposes may be considered a series of adjacent memory cells, each specified by a unique address. The write operation starts at the first memory location, and proceeds in sequence through all the adjacent memory locations until reaching the end location. Then, the write operation begins again at the first location, thereby cycling repetitively through the memory array. Similarly, the read operation cycles repetitively through the memory array.

However, the read operation must not advance to a location beyond that which has been written into in the current cycle, or else old data (from an earlier cycle) will be read. It is often said that a write "pointer" marks the memory location currently selected for writing, while a read "pointer" marks the memory location currently selected for reading. Some method of generating pointers (i.e., selecting memory locations) must be provided, and also some method must be provided for keeping track of the pointers, at least to the extent of ensuring that the read pointer does not advance beyond the write pointer. For this purpose, a "flag" is normally generated when both pointers advance to the same memory location. A "full" flag indicates that the write pointer has advanced one complete cycle beyond the read pointer. Hence, the microprocessor or other circuitry that writes into the FIFO is instructed to halt operation until the FIFO has been read. Similarly, an "empty" flag indicates that the read pointer has advanced up to the same location (or the next adjacent location) as the write pointer, so that all of the information previously stored in the FIFO has been read out. Then, the microprocessor or other circuitry that reads from the FIFO is instructed to halt until more information had been written into the FIFO, thereby preventing old information from being erroneously read as current information. It is also known to generate partially-full (e.g., half-full) flags for various control purposes.

One prior-art "first in, first out" (FIFO) memory architecture requires counters, separate from the dual-port memory block, to generate read and write addresses. These addresses are decoded to access particular words in the dual-port memory, and are compared to generate the full and empty flags. However, the prior-art address generators and flag generators are not incorporated into the memory block, thereby requiring individual layout for each different size FIFO, and having a negative impact on performance and design cycle time. Another known type of FIFO memory architecture uses shift registers to sequence the read and write address by advancing a "1" through either shift register to indicate the present address; see, for example, U.S. Pat. No. 4,535,427 for one such design. In that technique, each bit of the read and write side shift register accesses a distinct word line from the dual-port memory. However, the prior-art still required the use of counters to generate the full and empty flags.

SUMMARY OF THE INVENTION

I have invented a first in, first out memory that includes a multi-port memory that is accessed for read/write operations by activating a selected read/write word line. In order to generate "full" and "empty" flags, the "pointers" that define the addresses of the activated read and write word lines are compared by an array of match circuits. In a preferred embodiment, the word line addresses are generated by a read shift register, and a write shift register.

DETAILED DESCRIPTION

The following detailed description relates to a first in, first out memory (FIFO) that includes an array of "match circuits" for generating status flags. The inventive technique generates the status flags by comparing active word lines to current read and write pointer values. An empty flag may be generated by comparing active read word lines to the write pointer through single row look-ahead. A match indicates that the read pointer has caught up to the write pointer and sets the empty flag. Similarly, a full flag may be generated by comparing active write word lines to the read pointer through single row look-ahead. A match indicates that the write pointer has caught up to the read pointer and sets the full flag. Other flags indicating various other conditions (e.g., half full, etc.) may be generated by looking ahead more than a single row. As used herein, the term "pointer generator" refers to the means for sequentially activating the word lines. In the illustrative case, a shift register is used as the pointer generator for each set of read/write word lines. The term "pointer" refers to the location of the word line that is being activated by a pointer generator.

Figure 1:
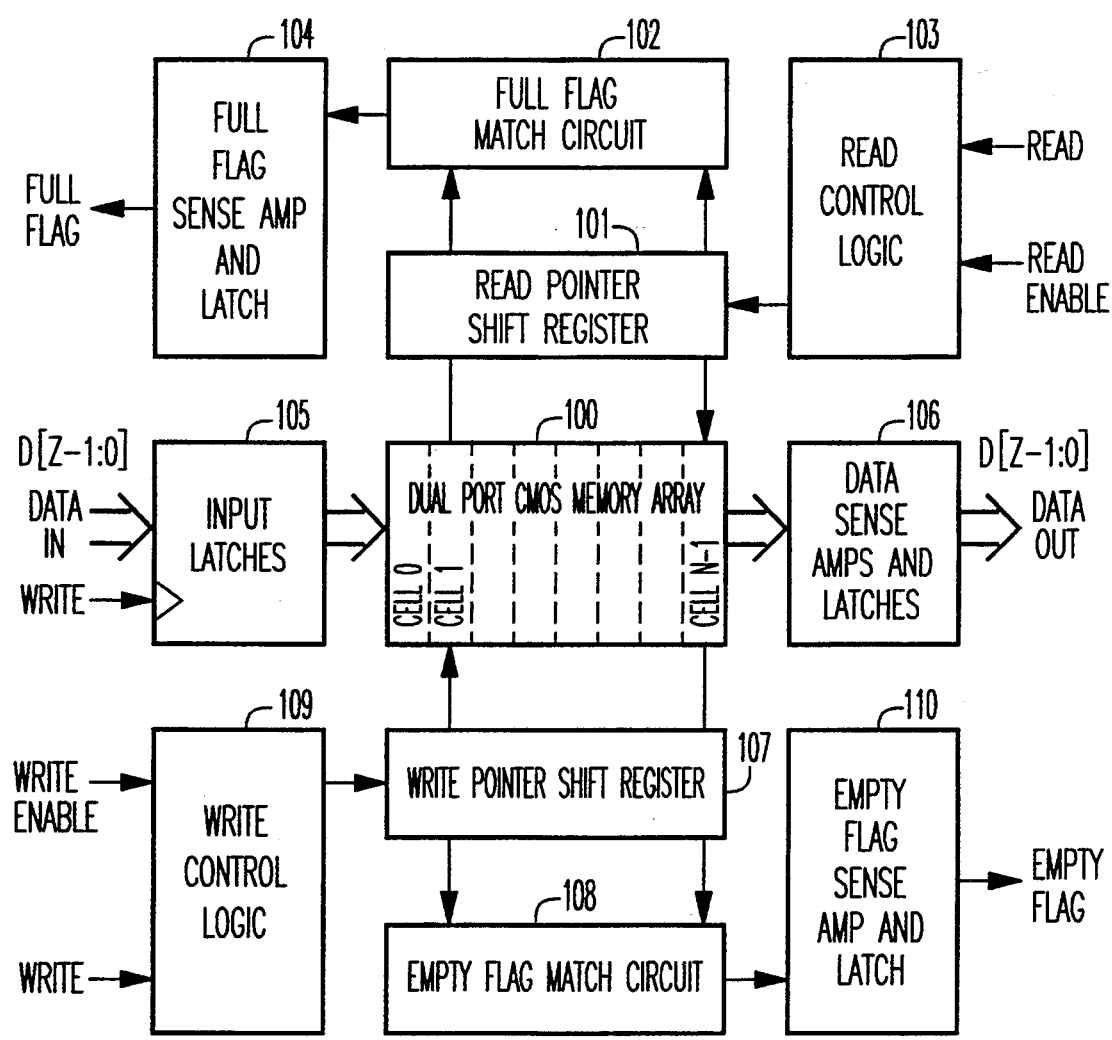
FIG. 1 shows a block diagram of an illustrative FIFO that may utilize the present invention.

Referring to FIG. 1, an illustrative FIFO that advantageously utilizes the invention is shown, with other designs being possible. A dual-port memory array (100) includes N words of memory, with each word including Z bits. For this purpose, the memory is arranged in N rows of memory cells (0 through N−1), and Z columns. The array 100 is accessed for read operations by selecting a "read" word line by means of the read pointer shift register 101. The shift register 101 includes a single "1" bit that advances in a single direction through the array, from row 0 to row N−1. The "1" bit then recirculates back to the beginning of the array (row 0) after reaching the end (row N−1). Similarly, the array 100 is accessed for write operations by selecting a "write" word line. The write pointer shift register 107 selects a given write word line by similarly advancing a "1" bit through the array from row 0 to row N−1, and back to row 0 for the next cycle. The FIFO read and write pointer shift registers may be implemented according to conventional techniques, as shown for example in the above-noted U.S. Pat. No. 4,535,427. However, other shift register designs are possible, as when implementing a bidirectional shift register, for example. The information for writing into a selected cell is provided from the input latches 105. The information read from a selected cell is sensed and latched by the sense amplifiers and latches 106. The write operation is controlled by write control logic 109, and the read operation is controlled by read control logic 103.

The present invention provides for a full flag match circuit 102 and an empty flag match circuit 108 according to a technique that determines the voltage state of selected word lines. The invention thereby avoids the use of counters, as required by prior-art techniques, at least for performing these functions. The full flag is sensed and latched by means 104, and similarly the empty flag is sensed and latched by means 110.

Figure 2:
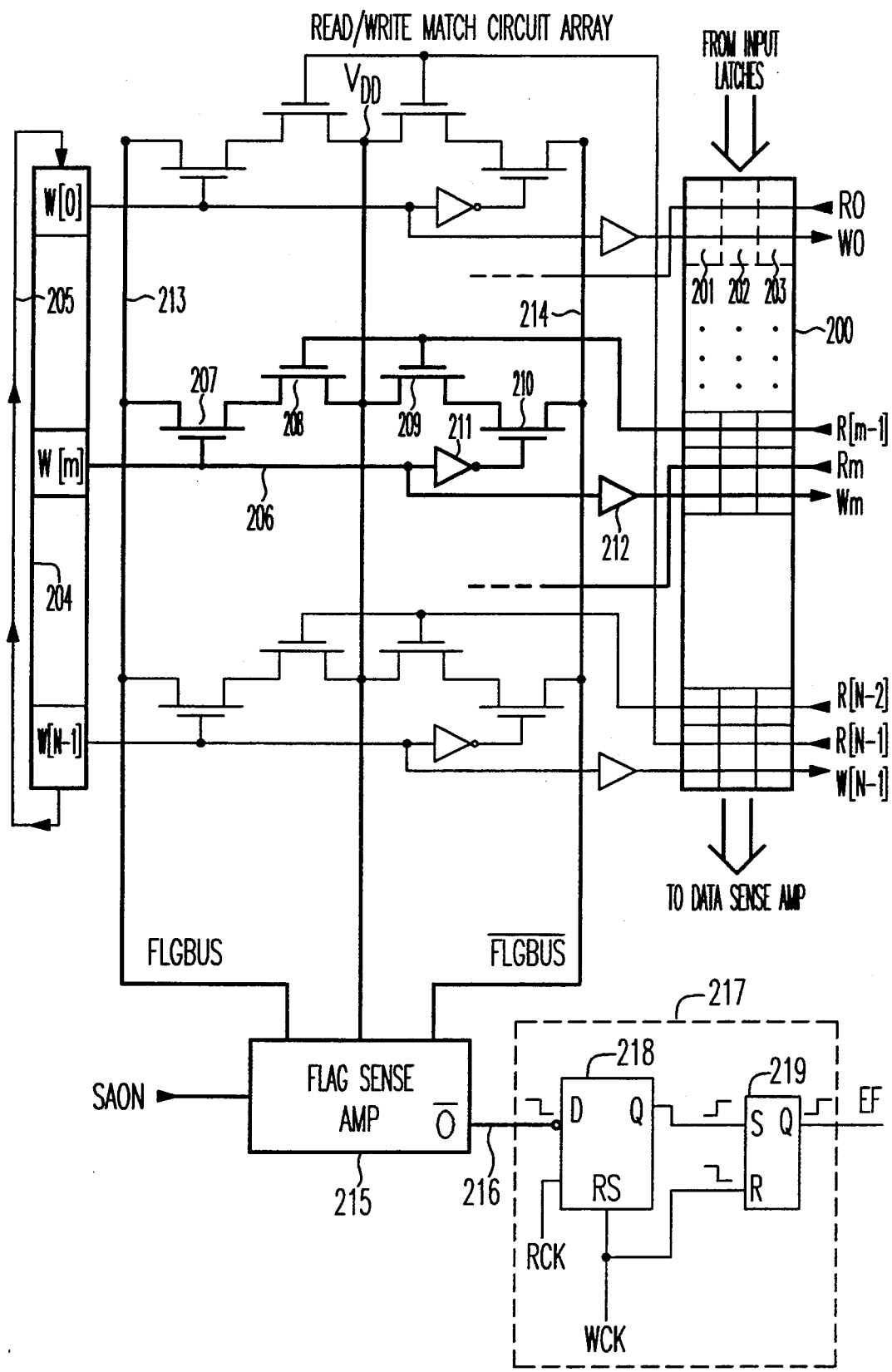
FIG. 2 shows an illustrative embodiment of the present invention.

Referring to FIG. 2, one illustrative circuit embodiment of the present invention is shown, with others being possible. The embodiment illustrated provides the "empty" flag. Similar circuitry (discussed below) may be used to provide a "full" flag. The memory array 200 is a dual-port array having memory cells (e.g., 201, 202, 203) that are accessed via a read word line (e.g., R0 . . . R[N−1]) and a write word line (e.g., W0 . . . W[N−1]). When a given read word line is activated, data may be read from the one or more cells along a given row in the memory array, and provided to the sense amplifiers. The data may be optionally latched, and provided to external circuitry via the DATA OUT lines (FIG. 1). When a given write word line is activated, data may be written into one or more cells along a given row from the input circuitry, which may optionally include latches (FIG. 1). For these purposes, data is read into the array, and read out of the array, via bit lines that are not shown for simplicity of illustration.

In the illustrative embodiment herein, the word line is activated for a read or write operation when the word-line voltage is high (e.g., near $V_{DD}$), and is deactivated when the word-line voltage is low (e.g., near $V_{SS}$). This is the case when n-channel access transistors are used for both the read and write word lines, since they conduct with a high gate voltage. However, other multi-port cell designs may be used with the inventive technique; see for example, U.S. Pat. No. 4,660,177 co-assigned herewith, wherein an n-channel transistor provides access to one port, while a p-channel transistor is used for access to another port. In that case, the p-channel transistor conducts to provide access to the cell when the associated word line voltage is low, and does not conduct when the voltage is high.

In the embodiment of FIG. 2, the write word lines are sequentially activated by a single bit, illustratively a "1" bit, that circulates around the write pointer shift register 204. The "1" bit starts at bit position W[0] and continues to bit position W[N−1], where it recirculates via line 205 back to the initial bit position. The shift register 204 may be controlled by a clock (not shown). For example, two clock phases may be used: in the high phase, the shift register is advanced, and during the low phase, the selected word line is turned on. Similarly, the read word lines are sequentially activated by a single bit circulating around the read pointer shift register (shown in FIG. 1). As these read and write pointer "1" bits circulate, they sequentially activate portions of the "Read/Write Match Circuit". This circuit comprises an array of match circuits, with one match circuit being provided for each read/write word line pair. The match circuits each have a single input (e.g., line 206), and determine whether that input is at a high or low voltage state. In the illustrative case, each match circuit is activated by an desired word line, (e.g., R[m−1]), which is in turn activated by the associated (e.g., read) pointer generator. As illustrated, the input to the match circuit is connected directly to a given location of the write pointer generator. However, the alternate design is possible, wherein a given match circuit is activated directly by a given location of the pointer generator, and the match circuit input is connected to the desired word line.

For illustrative purposes, the "1" bit is considered to occupy the bit position W[m] in the write pointer shift register 204, where it causes a high voltage to appear on conductor 206. This high voltage on conductor 206 causes transistor 207 to conduct, and causes inverter inverter 211 to place a low voltage on the gate of transistor 210, preventing it from conducting. The high voltage on 206 also causes a high voltage to appear, through buffer 212, on the write word line Wm. The gate voltage on match circuit transistors 208 and 209 is from the read word line R[m−1], which is from the memory cells immediately previous to the write word line Wm. ("Previous" refers to the sequence in which the read and write pointer shift registers activate the word lines.) Therefore, if the read pointer advances to read line R[m−1], then a high voltage appears on the read word line R[m−1], causing transistors 208 and 209 to conduct. Since 207 is also conducting a current will be conducted from $V_{DD}$ to the flag sense amplifier 215 via the match circuit bit line 213 (FLGBUS). Conversely, no current is conducted via bit line 214 ($\overline{\text{FLGBUS}}$), since transistor 210 is non-conducting. This difference in currents causes a relatively small differential voltage to appear on the match circuit bit lines 213, 214, being typically around 100 to 300 millivolts above $V_{SS}$. This differential voltage is sensed by the sense amplifier 215, which causes a negative-going transition (from high to low) on the $\overline{O}$ output and line 216.

It can thus be seen that with respect to the read pointer, the match circuit comprising transistors 207–210 and inverter 211 looks ahead one row of memory cells to compare the current location of the read pointer with the current location of the write pointer. If a match occurs, this indicates that the read pointer has advanced to the the row (m−1) adjacent to that of the write pointer (m), and the memory is considered "empty". The resulting high-to-low transition on line 216 is conducted to an output latch circuit 217, which sets the empty flag EF. If a match does not occur, then line 216 remains in a high voltage state, and the empty flag EF is not set.

Various forms of latch circuits are known in the art, and may be used in practicing the present invention. However, the circuit illustrated provides a high degree of protection against metastable states that can cause asynchronous circuits to "hang" in an indeterminate state between high and low voltage levels. For this purpose, the output ($\overline{O}$) from the flag sense amplifier 215 is provided to the data (D) input of the edge-sensitive latch 218. The latch 218 is asynchronously reset (Q=0) by the write clock WCK applied to the RS input. The latch 218 is clocked by the rising edge of the read clock RCK and reset while the write clock WCK is high. The output of this latch sets an SR latch (219). The falling edge of the write clock resets the latch 219. A set empty flag inhibits the read clock, which prevents the read clock from clocking the latch 218. Asynchronous writes will not reset the empty flag latch 219 until the sense amplifier 215 has been turned on and new data to the latch has been set up on 216. Therefore, latch 218 will not be clocked into a metastable state.

Figure 3:
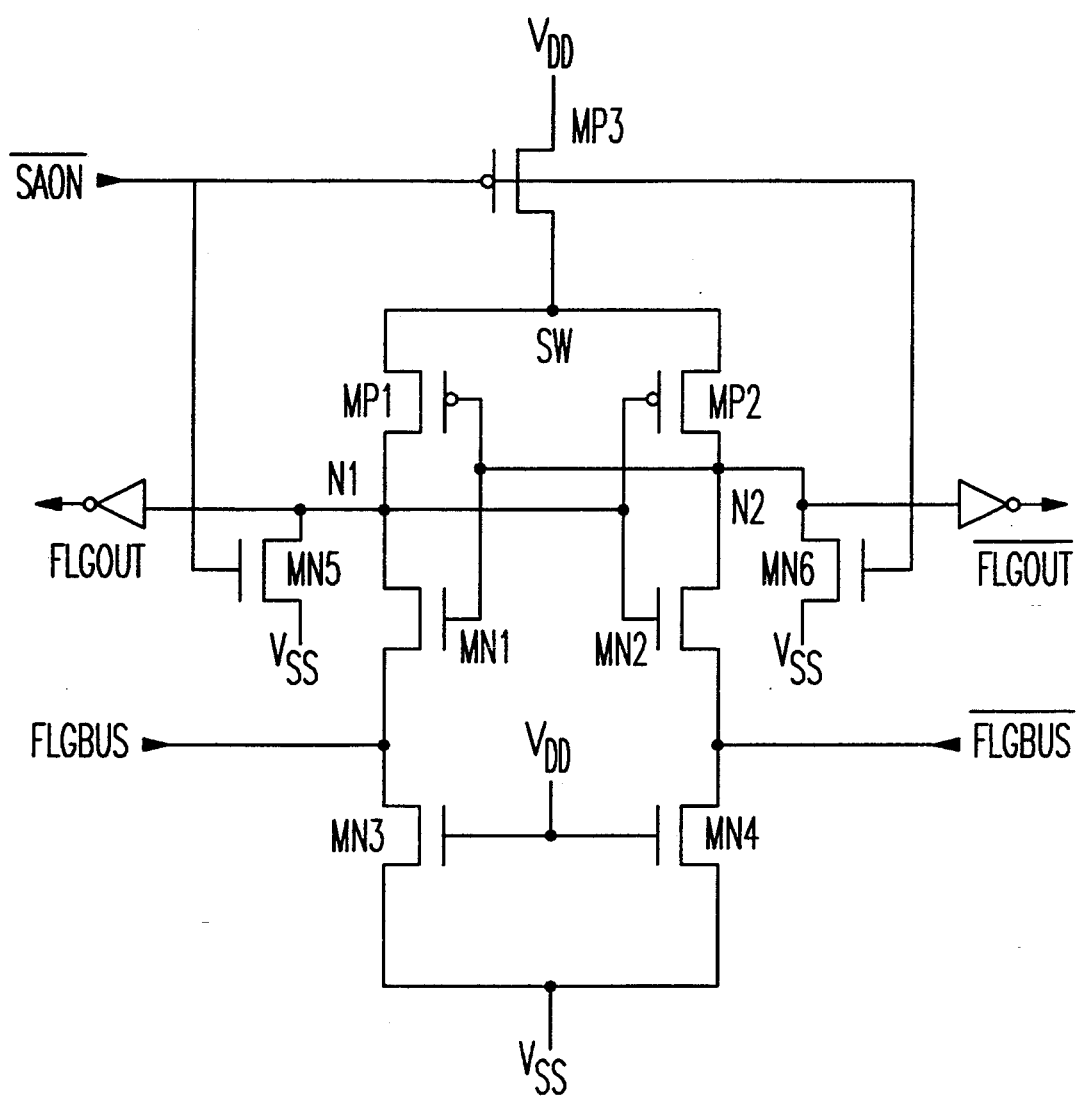
FIG. 3 shows an illustrative current-mode sense amplifier that may be used with the present invention.

One presently-preferred form of sense amplifier is shown in FIG. 3, which implements a differential current mode sensing technique. The current sense amplifier devices MN1, MN2 and MP1, MP2 form a high gain regenerative amplifier switched by MP3. The cascode connection of device pairs MN1-MN3 and MN2-MN4 buffer the lightly-loaded nodes N1 and N2 from the high capacitance current input nodes of the flag busses. A pointer-to-word line match produces current in FLGBUS, while the absence of a match shifts the current to $\overline{FLGBUS}$. For determining the state of the empty flag, the sense amplifier clock-on signal. (SAON) is held high while the write pointer is moving, or while the read word lines move. The sense amplifier output (O) is high while the sense amplifier is turned off. Note that the read word lines are active only when the read clock (RCK) is low. When RCK is high, SAON is high and the match circuits are not evaluated. SAON is kept high until either FLGBUS or $\overline{FLGBUS}$ reaches steady state. Then, the falling edge of SAON turns the sense amplifier on.

The use of a differential current-mode sense amplifier, as shown in the above embodiment, provides for high speed operation when significant capacitive loads are present on the match circuit bit lines FLGBUS (213) and $\overline{FLGBUS}$ (214). However, the use of a sense amplifier is optional insofar as the present invention is concerned. Furthermore, the sense amplifier, if used, need not necessarily be a balanced-input type as shown. That is, a single-ended type of sense amplifier, as is known in the art, may be used. In that case, only a single match circuit bit line (e.g., FLGBUS) need be used. While the match circuit circuitry shown in FIG. 2 has been found to be advantageous for high speed operation with bit lines that present a significant capacitive load, other designs are possible. For example, a single-ended design may be implemented using transmission gate circuitry. In that case, an n-channel transistor may have one source/drain region connected to the write pointer generator (e.g., via line 206), with the other source/drain region connected to the input of a driver that drives the latch circuitry (e.g., 217) directly, without a sense amplifier. The gate of the n-channel transistor is then connected to the read word line that is being compared (e.g., R[m−1]). A p-channel transistor has source/drain regions connected to those of the n-channel transistor, but with the gate of the p-channel transistor being driven by the output of an inverter whose input is also connected to the read word line that is being compared. Still other match circuit designs are possible.

While the above embodiment has illustrated the present invention for generating an empty flag, a full flag may be generated in a similar manner. In that case, the read pointer location may also be compared to the write pointer location using match circuits comparable to those shown in FIG. 2. However, the single-row look ahead is accomplished by comparing a given write word line to the location of the next (in direction of advancement) read pointer. That is, the gates of two match circuit transistors comparable to 208-209 are connected to a given write word line; e.g., W[m−1]. The gate of the match circuit transistor comparable to 207 is connected so as to be activated by the read pointer location that activates the next succeeding read word line in the direction of advancement; e.g., R[m]. Then, a match indicates that the write pointer has advanced to the row of memory cells adjacent to those selected by the read pointer, and hence the FIFO is full. As noted above, other flags (half-full, etc.) may be set by looking ahead more than one row. In fact, programmable circuitry may be included to allow the user to select where the comparison occurs. Then, the number of rows that a given pointer is ahead of the row activated by the other pointer may be chosen to provide for programmable status flags.

If desired, the word lines may be pulsed to minimize power dissipation in the data sense amplifier and flag generation circuits. In that case, the word lines may be latched to facilitate the look-ahead matching. As the word lines are advanced, the asynchronous latches trap the current word line position and reset the previous word line latch.

In practicing the present invention, the memory cells (201, 202, 203, etc.) may be of a variety of designs. Although a dual-port memory is shown in FIGS. 1 and 2, additional ports may be provided, typically by providing additional access transistors to the cells according to techniques known in the art. Hence, as used herein, the term "multi-port" memory includes those memory arrays accessed via two or more ports. Furthermore, the above-described multi-port memory designs utilize spatially separate word lines (e.g., Rm, Wm) to provide access for each port of a given cell. However, it is alternatively possible to time-multiplex a single word line to perform the functions of a multi-port memory. For example, arbitration circuitry known in the art allows a single-port memory array to function as a dual-port design; see for example, U.S. Pat. No. 4,620,118 "Dual Port Access Circuit with Automatic Asynchronous Contention Resolving Capability" co-assigned herewith. The present invention may be also practiced with such a time-multiplexed multi-port memory design. In that case, the terms "mad word line" and "write word line" refer to those periods of time when a given word line provides those access functions to a given cell.

Column multiplexing may also be used with the present invention. That is, a given row of memory cells may include two (or more) cells that are accessed by a given word line. However, only one of the cells may be selected by the column multiplexer for performing a read or write operation. This allows for a more compact and regular layout that is convenient when implementing the present invention in an application specific integrated circuit (ASIC), for example. However, the present invention may alternatively be implemented with the pointer generators located on one or more integrated circuits separate from the memory array. Furthermore, while shift registers are advantageously used to implement the pointer generators, other techniques (e.g., address decoders, etc.) may be used to generate the pointers when practicing the invention. Still other variations on the embodiment shown above are possible.

We claim:

1. A circuit including a first in, first out memory comprising an array of memory cells arranged in rows that are accessed by word lines that are activated by a read pointer generator when performing a read operation, and by a write pointer generator when performing a write operation, and further comprising means for generating at least one flag indicating the amount of data written into the memory that has not been read out, Characterized in that said means comprises a multiplicity of match circuits each associated with a corresponding row and connected to a given one of the read or write pointer generators, and also connected to the word line in the corresponding row that is activated by the other one of the read or write pointer generators, wherein said match circuits each determine whether a pointer generated by one of the pointer generators has advanced to a given word line.

2. The circuit of claim 1 wherein said given one of the read or write pointer generators is the write pointer generator, and said given word line is a read word line that is activated by the read pointer generator.

3. The circuit of claim 2 wherein a given one of said match circuits is activated by a read word line at a given location and determines the state of the write pointer generator at the next successive location, whereby said at least one flag is an empty flag.

4. The circuit of claim 1 wherein said given one of the read or write pointer generators is the read pointer generator, and said given word line is a write word line that is activated by the write pointer generator.

5. The circuit of claim 4 wherein a given one of said match circuits is activated by a write word line at a given location and determines the state of the read pointer generator at the next successive location, whereby said at least one flag is a full flag.

6. The circuit of claim 1 wherein said memory cells are multi-port cells, wherein the word lines activated by the read pointer generator are connected to a first port of said cells, and wherein the word lines activated by the write pointer generator are connected to a second port of said cells.

7. The circuit of claim 1 wherein said match circuits are each connected to a match circuit bit line, and a complementary match circuit bit line, that connect to a differential flag sense amplifier that produces a signal for setting a flag when a match occurs.

8. The circuit of claim 7 wherein said match circuits each comprise:
first and second transistors each having a first source/drain electrode connected to said bit line and said complementary bit line, respectively;
third and fourth transistors each having first source/drain electrodes connected to the second source/drain electrodes of said first and second transistors, respectively, and having second source/drain electrodes connected to a power supply conductor;
wherein the gate electrodes of said first and second transistors are coupled to a given one of said read and write pointer generators, and wherein the gate electrodes of said third and fourth transistors are coupled to a word line activated by the other one of said read and write pointer generators.

9. The circuit of claim 1 wherein said read pointer generator is a shift register located on the same integrated circuit as said memory array.

10. The circuit of claim 1 wherein said write pointer generator is a shift register located on the same integrated circuit as said memory array.

11. An integrated circuit including a first in, first out memory comprising an array of memory cells arranged in rows that are accessed by word lines that are activated by a read pointer shift register when performing a read operation, and by a write pointer shift register when performing a write operation, and further comprising means for generating at least one flag indicating the amount of data written into the memory that has not been read out, Characterized in that said means comprises a multiplicity of match circuits that are sequentially activated by a given one of the read or write pointer shift register, and with a word line in each row being connected to an associated match circuit, wherein said match circuits each determine whether a given one of the multiplicity of word lines is activated by the other one of said pointer shift registers;

and wherein said memory cells are multi-port cells, wherein the word lines activated by the read pointer shift register are connected to a first port of said cells, and wherein the word lines activated by the write pointer shift register are connected to a second port of said cells; and further characterized in that said match circuits are each connected to a match circuit bit line, and a complementary match circuit bit line, that connect to a differential flag sense amplifier that produces a signal for setting a flag when a match occurs.

12. The integrated circuit of claim 11 wherein said match circuits each comprise:
first and second transistors each having a first source/drain electrode connected to said bit line and said complementary bit line, respectively;
third and fourth transistors each having first source/drain electrodes connected to the second source/drain electrodes of said first and second transistors, respectively, and having second source/drain electrodes connected to a power supply conductor;
wherein the gate electrodes of said first and second transistors are coupled to a given one of said read and write pointer shift registers, and wherein the gate electrodes of said third and fourth transistors are coupled to a word line activated by the other one of said read and write pointer shift registers.

13. The integrated circuit of claim 12 wherein said first, second, third, and fourth transistors are n-channel field effect transistors, and wherein an inverter couples said given one of said read and write pointer shift registers to said gate electrode of said second transistor.

* * * * *